(12) United States Patent
Morishima

(10) Patent No.: US 9,055,710 B2
(45) Date of Patent: Jun. 9, 2015

(54) COMPONENT MOUNTING DEVICE AND A TRAY EXCHANGING METHOD IN A TRAY FEEDER

(75) Inventor: Mie Morishima, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 181 days.

(21) Appl. No.: 13/578,154

(22) PCT Filed: Nov. 21, 2011

(86) PCT No.: PCT/JP2011/006476
§ 371 (c)(1),
(2), (4) Date: Aug. 9, 2012

(87) PCT Pub. No.: WO2012/070224
PCT Pub. Date: May 31, 2012

(65) Prior Publication Data
US 2012/0308359 A1     Dec. 6, 2012

(30) Foreign Application Priority Data
Nov. 26, 2010 (JP) ................................. 2010-263368

(51) Int. Cl.
 *H05K 13/04* (2006.01)
(52) U.S. Cl.
 CPC ................................. *H05K 13/0434* (2013.01)
(58) Field of Classification Search
 USPC .................... 414/268, 273, 280, 286, 331.01, 414/416.01, 807, 811
 See application file for complete search history.

(56) References Cited

U.S. PATENT DOCUMENTS

| | | | | |
|---|---|---|---|---|
| 5,032,053 A | * | 7/1991 | Krieg | 414/278 |
| 5,380,138 A | * | 1/1995 | Kasai et al. | 414/277 |
| 5,930,144 A | * | 7/1999 | Kondo et al. | 700/214 |
| 6,036,425 A | * | 3/2000 | Seto | 414/277 |
| 6,079,096 A | | 6/2000 | Hata et al. | |
| 6,524,052 B1 | * | 2/2003 | Yamauchi et al. | 414/331.1 |

(Continued)

FOREIGN PATENT DOCUMENTS

| | | |
|---|---|---|
| CN | 1197587 A | 10/1998 |
| CN | 1201587 A | 12/1998 |

(Continued)

OTHER PUBLICATIONS

Chinese Office action for Application No. 201180010521.X dated Dec. 25, 2014.

(Continued)

*Primary Examiner* — Kaitlin Joerger
(74) *Attorney, Agent, or Firm* — Pearne & Gordon LLP

(57) ABSTRACT

In a palette movement in which a palette (24) which holds a tray (6) whose components are used up is moved from a palette carrying part (27) where the palette (24) was carried for the exchange with a new tray (6) to a palette accommodating part (23), the accommodating address of the return destination is specified based on a readout result of a palette identification mark of a palette information readout sensor (32) and palette accommodating data which are stored in advance. Therefore, even if the components in two or more palettes (24) are used up in the same period, the palettes (24) can be returned to the palette accommodating parts (23) corresponding to the specified accommodating addresses of the return destinations.

4 Claims, 8 Drawing Sheets

(56) References Cited

U.S. PATENT DOCUMENTS

| | | | |
|---|---|---|---|
| 6,616,401 B2* | 9/2003 | Nakamura et al. | 414/811 |
| 7,329,083 B2* | 2/2008 | Nakazato et al. | 414/788.7 |
| 2002/0003995 A1* | 1/2002 | Nakamura et al. | 414/416.01 |
| 2002/0133940 A1 | 9/2002 | Kadomatsu et al. | |
| 2003/0068216 A1 | 4/2003 | Takaiti et al. | |
| 2010/0014948 A1 | 1/2010 | Higashida | |

FOREIGN PATENT DOCUMENTS

| | | |
|---|---|---|
| CN | 101589658 A | 11/2009 |
| EP | 0868117 A1 | 9/1998 |
| JP | 03-221334 A | 9/1991 |
| JP | 11-289189 A | 10/1999 |
| JP | 2002-359494 A | 12/2002 |
| JP | 2004-335951 A | 11/2004 |
| JP | 2009-124065 A | 6/2009 |

OTHER PUBLICATIONS

International Search Report for PCT/JP2011/006476 dated Jan. 10, 2012.

* cited by examiner

COMPONENT MOUNTING DEVICE AND A TRAY EXCHANGING METHOD IN A TRAY FEEDER

TECHNICAL FIELD

The present invention relates to a component mounting device that picks up a component with a mounting head from a tray feeder and mounts the component on a board, and a tray exchanging method in a tray feeder that exchanges a tray whose components are used up in the tray feeder.

BACKGROUND ART

A tray feeder is known as a kind of parts feeder that supplies components such as semiconductor chips in a component mounting device. The tray feeder is formed so that palettes which hold trays in which components are stored are respectively accommodated in a plurality of palette accommodating parts which are provided in parallel at multiple levels from top to bottom. In a component mounting operation, these palettes are drawn out in accordance with a mounting order and moved to a component takeout position. When the components of the tray in a palette are used up, the palette whose components are used up is moved to a palette carrying part which is provided in an area different from the palette accommodating parts, and a tray exchange operation is performed in which the tray is exchanged with a new tray (for example, refer to a patent document 1). In the related art shown in this patent document, by temporarily accommodating new palettes for exchange in unoccupied palette accommodating parts in the plurality of palette accommodating parts, even if the palette whose components are used up is accommodated in the palette accommodating part as it is, the palette can be exchanged with a palette which holds a tray in which new components of the same type are stored.

RELATED ART DOCUMENT

Patent Documents

Patent document 1: Japan Patent Publication No. 2009-124065

SUMMARY OF THE INVENTION

Problems to be Solved by the Invention

In the component mounting device, accommodating addresses which indicate the accommodating positions of the plurality of palette accommodating parts of the tray feeder respectively in the tray feeder are set. In the component mounting operation, the palettes are drawn out from the tray feeder according to the component mounting order indicated by mounting data with reference to component accommodating position information indicating the correspondence of component types and the accommodating addresses. However, in the example of above-mentioned related art, because the unoccupied palette accommodating parts are used temporarily, it is necessary to replace the palettes again in order to arrange the palettes according to the component accommodating position information. Because this palette replacement must be conducted in a device stop state, the productivity of the device is definitely decreased.

In the component mounting operation, not only it is possible that the components in one palette are used up, but also it is possible that the components in two or more palettes are used up in the same period. In such instances, in the related art including the above-mentioned patent document, other palettes cannot become the object of the tray exchange operation until the tray exchange of one palette is completed. Therefore, similarly, the productivity of the device is decrease because the device stop time for the purpose of tray exchange is prolonged.

Thus, the invention is intended to provide a component mounting device and a tray exchanging method in a tray feeder so that the productivity can be increased by shortening the device stop time for the purpose of tray exchange in the component mounting device which mounts components supplied by the tray feeder on a board.

Means for Solving the Problems

A component mounting device of this invention is a component mounting device which picks up from a tray feeder, in which palettes which hold trays in which components are stored are respectively accommodated in a plurality of palette accommodating parts and the palette is moved to a component takeout position, the component with a mounting head, and mounts the components on boards, wherein, the tray feeder comprises a feeder body in which the plurality of palette accommodating parts are provided to correspond to accommodating addresses, a palette carrying part which is provided in an area different from the palette accommodating parts, on which a palette which holds a tray whose components are used up can be carried, and from which the palette can be exported to the outside of the feeder body for the purpose of tray exchange, a palette moving part which performs palette movements including taking out the palette from the plurality of palette accommodating parts, making the palette to be moved to the component takeout position or onto the palette carrying part, and returning the palette to the palette accommodating part, an accommodating address specifying unit which specifies the accommodating address of the return destination of the palette in the palette movement from the palette carrying part to the palette accommodating part, and an operation resuming input unit which inputs an operation resuming order to resume the operation of picking up components of the mounting head after the pickup operation is temporarily stopped as a result of that the palette which holds the tray whose components are used up is moved onto the palette carrying part.

A tray exchanging method of this invention in a tray feeder, which is used by being installed to a component mounting device which mounts components on boards, and in which palettes which hold trays in which the components are stored are respectively accommodated in a plurality of palette accommodating parts and the palette is moved to a component takeout position, for exchanging the tray whose components are used up with a new tray, wherein the tray feeder comprises a feeder body in which the plurality of palette accommodating parts are provided to correspond to accommodating addresses, a palette carrying part which is provided in an area different from the palette accommodating parts, on which a palette which holds a tray whose components are used up can be carried, and from which the palette can be exported to the outside of the feeder body for the purpose of tray exchange, a palette moving part which performs palette movements including taking out the palette from the plurality of palette accommodating parts, making the palette to be moved to the component takeout position or onto the palette carrying part, and returning the palette to the palette accommodating part, an accommodating address specifying unit which specifies the accommodating address of the return destination of the palette in the palette movement from the palette carrying part to the palette accommodating part, and an operation resuming input unit which inputs an operation resuming order to resume the operation of picking up components of the mounting head after the pickup operation is temporarily stopped as a result of that the palette which holds the tray whose components are used up is moved onto the palette carrying part and exported to the outside of the feeder body, and the tray exchanging method comprises a first palette moving step to make a first palette which holds the tray whose components are used up to be moved to the palette carrying part, a first palette takeout step to take out the first palette from the palette carrying part, a second palette moving step to make a second palette which holds the tray whose components are newly used up to be moved to the palette carrying part when the tray exchange operation of the first palette has not been completed, a second palette takeout step to take out the second palette from the palette carrying part, a palette carrying step to carry either of the first palette and the second palette which has been tray exchanged onto the palette carrying part, an operation resuming input step to input an operation resuming order to make the pickup movement to be resumed, and a palette moving step to make either of the first palette and the second palette which is carried to be moved to the component takeout position or returned to the palette accommodating part of the accommodating address of the return destination of the palette which is specified by the accommodating address specifying unit according to the operation resuming order.

Effects of the Invention

According to the invention, the accommodating address specifying unit is included which specifies the accommodating address of the return destination of the palette movement in which the palette which holds the tray whose components are used up in the tray feeder is moved from the palette carrying part for the exchange with a new tray to the palette accommodating part for the return. Thus, in the component mounting device which mounts components supplied by the tray feeder on the board, even if the components in two or more palettes are used up in the same period, the palettes can be returned to the palette accommodating parts of the accommodating addresses of the return destinations of the palettes specified by the accommodating address specifying unit, and the productivity can be improved by shortening the device stop time for the purpose of tray exchange.

EMBODIMENTS OF THE INVENTION

Figure 1:
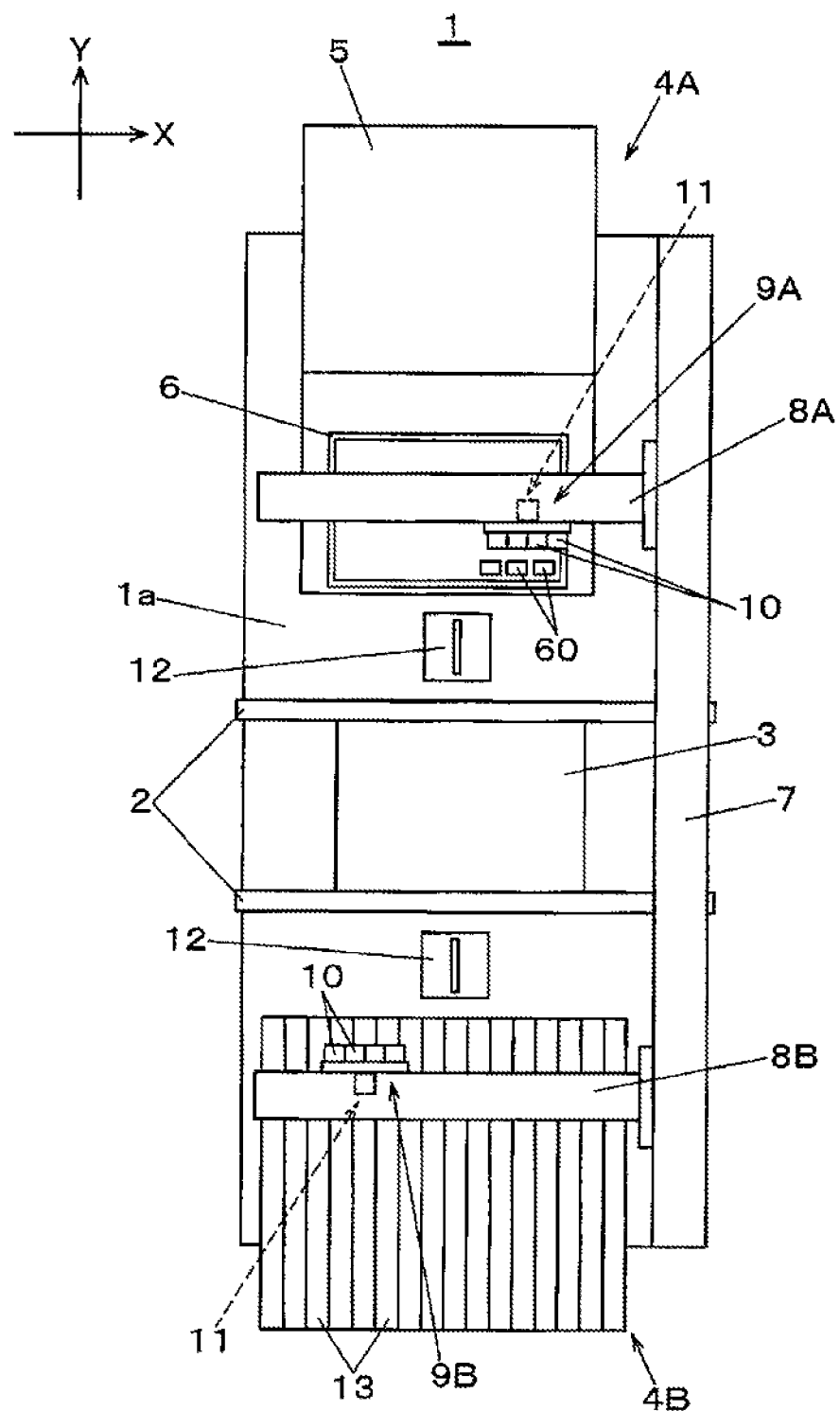
FIG. 1 is a top view of a component mounting device of one embodiment of the invention.

Next, an embodiment of the invention is described with reference to the figures. First, the structure of a component mounting device 1 is described with reference to FIGS. 1 and 2. In FIG. 1, a board conveying mechanism 2 is disposed in the X direction (board conveying direction) on the top surface of a base 1a. The board conveying mechanism 2 conveys a board 3 on which components are to be mounted, and positions and holds the board 3 at an operation position of a component mounting mechanism described below. Component supply parts 4A and 4B which supply components to be mounted on the board 3 are disposed at the two sides of the board conveying mechanism 2. A tray feeder 5 is arranged in the component supply part 4A, and a plurality of tape feeders 13 are arranged in the component supply part 4B. The tray feeder 5 supplies components 60 to a mounting head when a tray 6 in which the components 60 are stored with a lattice arrangement is moved to a component takeout position of the component mounting mechanism described below. The tape feeders 13 supply components to the component mounting mechanism by pitch sending carrier tapes which hold the components.

A Y axis movable table 7 which is driven by a linear motor is disposed in the Y direction at one end of the base 1a in the X direction, and two X axis movable tables 8A and 8B respectively corresponding to the component supply part 4A and the component supply part 4B are coupled to the Y axis movable table 7 to be movable in the Y direction. Mounting heads 9A and 9B are installed to the X axis movable tables 8A and 8B and can be moved in the X direction by linear driving mechanisms. Each of the mounting heads 9A and 9B is a multiple units type head which includes a plurality of unit transferring heads 10, and adsorbing nozzles 10a (refer to FIG. 2) are exchangeably installed to the lower ends of the unit transferring heads 10, respectively.

By driving the Y axis movable table 7 and the X axis movable table 8A, the mounting head 9A is horizontally moved between the component supply part 4A and the board 3 which is held by the board conveying mechanism 2, picks up a component 60 stored in the tray 6 by adsorbing and holding the component 60 with the adsorbing nozzle 10a, and mounts the component 60 on the board 3. By driving the Y axis movable table 7 and the X axis movable table 8B, the mounting head 9B is horizontally moved between the component supply part 4B and the board 3, takes out a component from the carrier tape which is pitch sent by the tape feeder 13 by adsorbing and holding the component with the adsorbing nozzle 10a, and mounts the component on the board 3. Therefore, the Y axis movable table 7, the X axis movable tables 8A and 8B, and the mounting heads 9A and 9B form a component mounting mechanism 46 (refer to FIG. 5) that adsorbs and holds components with the adsorbing nozzles 10a of the unit transferring heads 10, and mounts the components on the board 3.

Board recognition cameras 11, which are located at the bottom sides of the X axis movable tables 8A and 8B and moved integrally with the mounting heads 9A and 9B, are provided at the mounting heads 9A and 9B. The board recognition cameras 11 are moved integrally with the mounting heads 9A and 9B above the board 3, and image the board 3 to perform the position recognition of the board 3. Component recognition cameras 12 are disposed between the component supply parts 4A and 4B and the board conveying mechanism 2. When the mounting heads 9A and 9B which hold electronic components are moved to be above the component recognition cameras 12, the component recognition cameras 12 image these electronic components. The identification and the position recognition of the electronic components that are held by the mounting heads 9A and 9B are performed by recognizing the imaging result.

Figure 2:
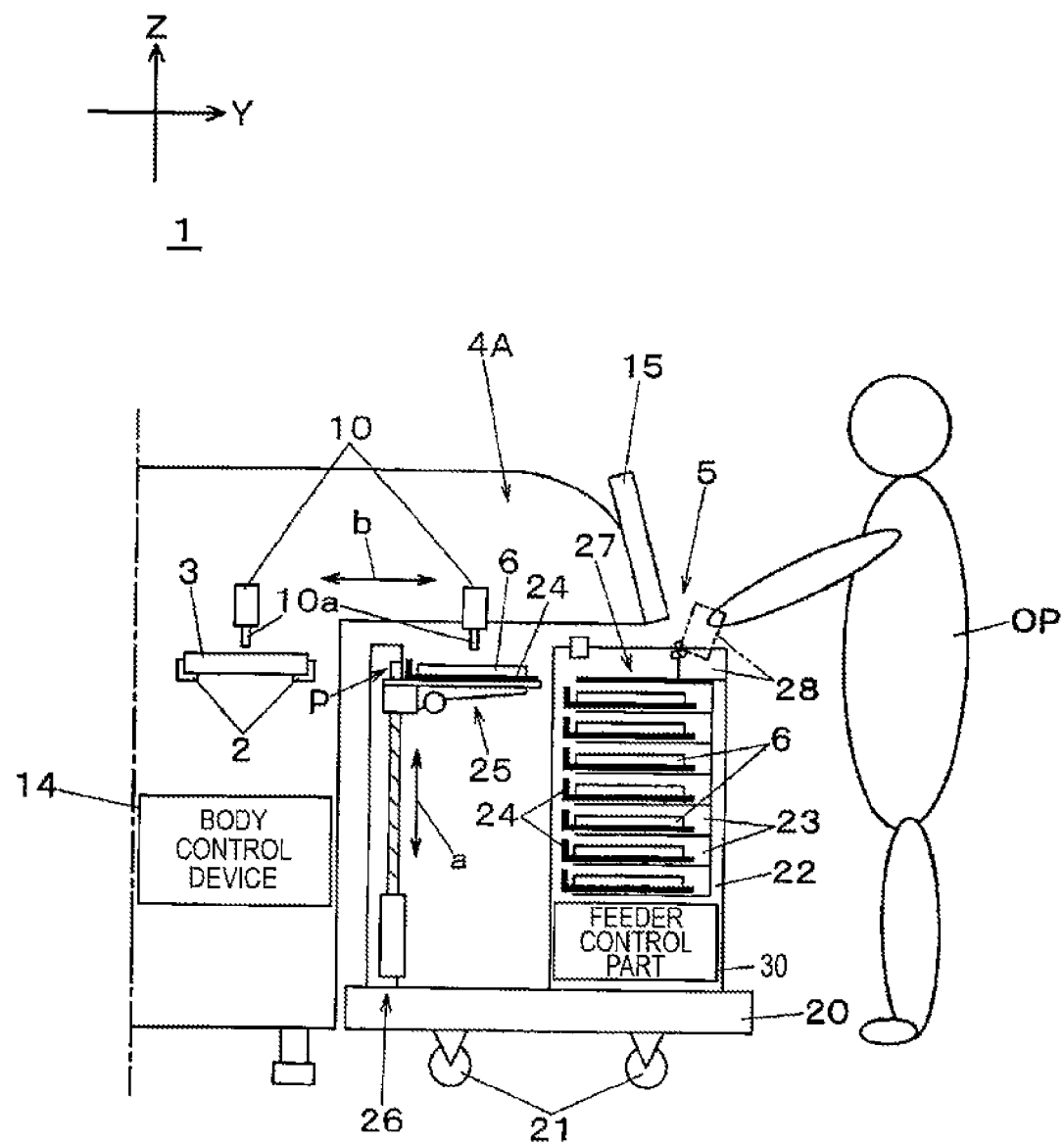
FIG. 2 is a partial sectional view of the component mounting device of the embodiment of the invention.

FIG. 2 shows that the tray feeder 5 is set in the component supply part 4A. The tray feeder 5 includes a base part 20 which can be moved on an operation floor with wheels 21. On the top surface of the base part 20, a feeder body 22 is arranged at the operation side of an operator OP. A plurality of palette accommodating parts 23 which accommodate palettes 24 that hold trays 6 are provided at multiple levels from top to bottom in the feeder body 22. A palette holding part 25 which draws out a palette 24 from the palette accommodating part 23 and holds the palette 24 and a holding part elevating mechanism 26 which elevates the palette holding part 25 (arrow a) to make the palette holding part 25 to be located at the height position of each of the palette accommodating parts 23 are provided at the front side of the feeder body 22 (the side of the component mounting device 1).

The tray 6 in which components 60 are stored with a lattice arrangement is held in the palette 24 (refer to FIG. 4(a)), and the tray 6 which is held in the palette 24 is accommodated in the individual palette accommodating part 23 of the feeder body 22. In a component mounting operation of the component mounting device 1, a palette 24 is drawn out by the palette holding part 25 and is moved to a component takeout position P of the unit transferring heads 10 of the mounting head 9A. By moving the mounting head 9A, which picked up a component 60 with the adsorbing nozzle 10a from the tray 6 in this state, to be above the board 3 which is positioned and held by the board conveying mechanism 2 (arrow b), the component 60 is mounted on the board 3.

The component mounting operation is controlled by a body control device 14, and the movement of the palette 24 in the tray feeder 5 is controlled by a feeder control part 30 which the tray feeder 5 includes. An operation panel 15, which is located at a position where the operator OP can easily view, is disposed at the component supply part 4A. Operations, which are necessary for the body control device 14, and further necessary for the feeder control part 30, can be input by operating a touch panel switch which is provided on the display surface of the operation panel 15.

A palette carrying part 27 is provided in an area different from the palette accommodating parts 23 in the feeder body 22 (herein, above the highest palette accommodating part 23). A palette 24, which holds a tray 6 whose components are used up during a component mounting operation, is carried on the palette carrying part 27 for the purpose of tray exchange. The top side of the palette carrying part 27 is covered by a ceiling of the feeder body 22. An opening and closing cover 28 is provided at the near side of the ceiling of the feeder body 22 (the operation side of the operator OP) to be freely opened/closed to make it possible to import/export the palette 24 to/from the palette carrying part 27. The opening and closing cover 28 is in a closed state during the component mounting operation.

When it becomes necessary to exchange the tray 6 which is held on the palette 24 during the component mounting operation, the palette 24 is moved from the palette holding part 25 and carried on the palette carrying part 27. Then, the operator OP opens the opening and closing cover 28 and exports the palette 24 from the palette carrying part 27, and the tray exchange in which the empty tray 6 whose components are used up is exchanged with another tray 6 is performed. The palette 24 after the tray exchange is exported through the opening and closing cover 28 and carried on the palette carrying part 27 again, and is further drawn out by the palette holding part 25. In other words, in the above structure, the palette 24 which holds the tray whose components are used up can be carried on the palette carrying part 27, and the palette 24 can be exported to the outside of the feeder body 22 for the purpose of tray exchange.

Figure 3:
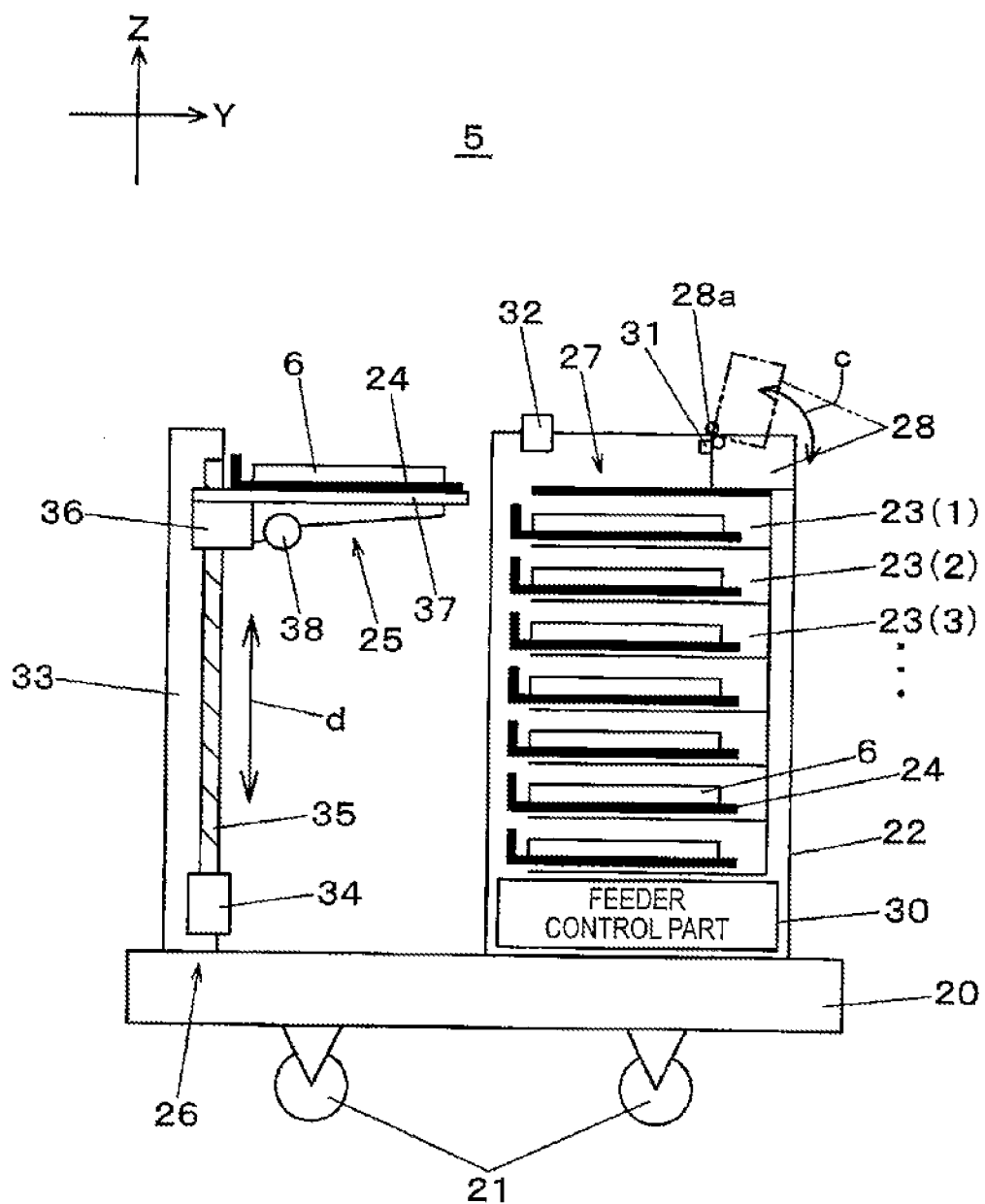
FIG. 3 is an illustrative figure of the structure of a tray feeder which is used in the component mounting device of the embodiment of the invention.

Next, a detailed structure of the tray feeder 5, and functions of the palette holding part 25 and the holding part elevating mechanism 26 are described with reference to FIGS. 3 and 4(a) to 4(c). In FIG. 3, the palette accommodating parts 23 which are provided at multiple levels inside the feeder body 22 correspond to accommodating addresses (herein, an order of (1) (2) (3) . . . from the highest level towards the lower levels), respectively. By specifying the accommodating address, the accommodating position where the individual palette 24 which holds the tray 6 is accommodated in the feeder body 22 can be specified.

The opening and closing cover 28 which is provided above the palette carrying part 27 is rotatable (arrow c) around a cover holding hinge 28a, and the opened and closed state of the opening and closing cover 28 is detected by a cover opening and closing detection switch 31. When the cover opening and closing detection switch 31 detects an opened state of the opening and closing cover 28, a signal is transmitted to the body control device 14 through the feeder control part 30. A palette information readout sensor 32 is disposed above the palette carrying part 27. The palette information readout sensor 32 functions as an identification unit which reads and identifies the presence or absence of the palette 24 in the palette carrying part 27 and a palette identification mark M (refer to FIGS. 4(a) to 4(c)) which is attached on the palette 24 carried on the palette carrying part 27 as an identification sign. The identification result of the palette information readout sensor 32 is transmitted to the body control device 14 through the feeder control part 30.

Next, the structure of the holding part elevating mechanism 26 is described. The holding part elevating mechanism 26 is provided at a vertical frame 33 which is raised on the top surface of the base part 20, and the holding part elevating mechanism 26 has such a structure that a sending screw 35 which is threadedly engaged with a nut member 36 is rotatably driven by an elevation driving motor 34. A horizontal palette holding plate 37 which forms the palette holding part 25 is coupled to the nut member 36. The palette holding part 25 is moved up and down at the front side of the feeder body 22 (arrow d) by driving the elevation driving motor 34. At this time, by specifying an accommodating address given to an individual palette accommodating part the palette holding part 25 can be located at the height position of the palette accommodating part 23 corresponding to the accommodating address.

The palette holding part 25 has a palette slide function which performs slide operations to draw out the palette 24 from the palette accommodating part 23 and return the drawn out palette 24 into the palette accommodating part 23. A slide driving motor 38 is disposed at the lower side of the palette holding plate 37, and by driving the slide driving motor 38, the palette 24 can be slid along the top surface of the palette holding plate 37. That is, as shown in FIG. 4 (a), on the top surface of the palette holding plate 37 which forms the palette holding part 25, a slide guide 42 is disposed in the Y direction (a direction of approaching and leaving the palette accommodating part 23), and a slide member 41 is slidably fitted with the slide guide 42.

The slide member 41 can be freely moved back and forth along the slide guide 42 by a moving mechanism (not shown in the figure) which assumes the slide driving motor 38 as a driving source, and includes a locking part 41a which can lock a locked part 24a which is provided at the front end of the palette 24. The palette 24 is accommodated in the palette accommodating part 23 to be protruded in the drawn-out direction so that the locked part 24a can be locked by the locking part 41a. Furthermore, on the top surface of the palette holding plate 37, guide members 43 for guiding the movement in the Y direction of the palette 24 are provided at two sides of the slide guide 42.

Figure 4:
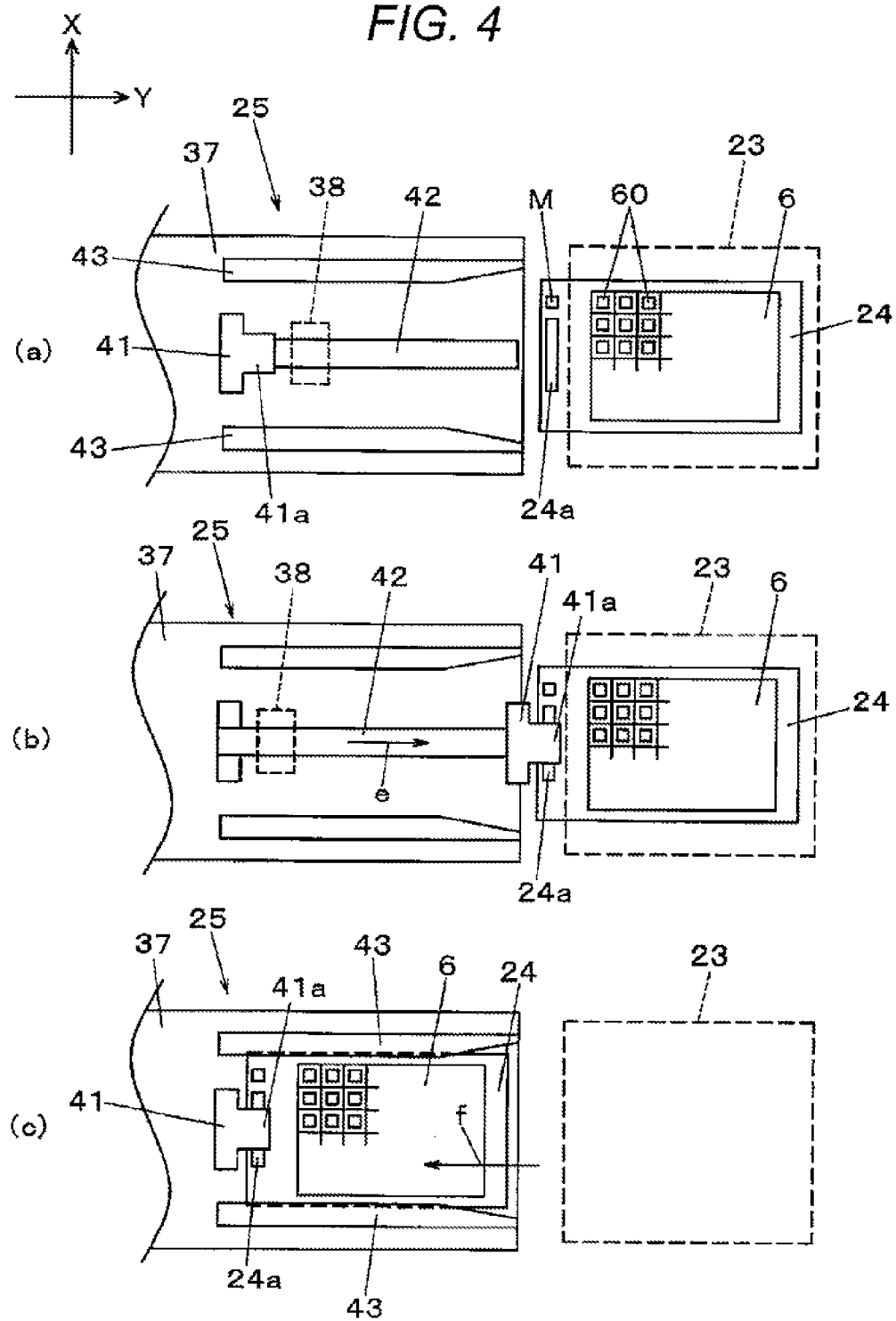
FIGS. 4(a), 4(b) and 4(c) are illustrative figures of the function of the tray feeder which is used in the component mounting device of the embodiment of the invention.

As shown in FIG. 4 (b), by driving the slide driving motor 38, the slide member 41 is moved in a direction of approaching the palette accommodating part 23 (arrow e) and the locked part 24a is locked by the locking part 41a. In this state, by driving the slide driving motor 38, the slide member 41 is moved towards a direction of separating from the palette accommodating part 23, and as shown in FIG. 4 (c), the palette 24 is drawn out from the palette accommodating part 23, and moved by the slide member 41 to be transferred on the top surface of the palette holding plate 37 and guided along the two side surfaces of the guide members 43 (arrow f). The above palette exporting and importing are performed by the palette holding part 25 not only for the palette accommodating part 23, but also for the palette carrying part 27.

That is, by making the palette holding part 25 to move up and down with the holding part elevating mechanism 26, the movement for the purpose of component supply in which a palette 24 is taken out from the plurality of palette accommodating parts 23 and moved to the component takeout position P of the unit transferring heads 10 of the mounting head 9A, the movement for the purpose of tray exchange in which the palette 24 is carried on the palette carrying part 27, and the movement in which the palette 24 after the component supply or after the tray exchange is returned to the palette accommodating part 23 of a predetermined accommodating address become possible. Therefore, the palette holding part 25 and the holding part elevating mechanism 26 form a palette moving part 47 (refer to FIG. 5) which performs palette moving actions including taking out the palette 24 from the plurality of palette accommodating parts 23, making the palette 24 to be moved to the component takeout position P or onto the palette carrying part 27, and returning the palette 24 to the palette accommodating part 23.

In the palette moving actions, after the palette 24 which is exported through the palette carrying part 27 for the purpose of tray exchange is imported to the palette carrying part 27 again after the tray exchange, when the palette 24 is returned into the palette accommodating part 23 from the palette carrying part 27, it is necessary to specify the accommodating address of the return destination of the palette 24 in the palette moving action. In this embodiment, two kinds of accommodating address specifying unit described below are selected to specify the accommodating address.

First, a first method is a method in which the accommodating address of the return destination is specified and input by an operator so that the accommodating address of the palette accommodating part 23 of the return destination is specified. That is, through the operation panel 15 (FIG. 2) which is provided at the component mounting device 1, an operator OP inputs the accommodating address of the palette accommodating part 23 where the palette 24 should be returned. When a signal is transmitted to the feeder control part 30 from the body control device 14 which receives the input accommodating address, the feeder control part 30 controls the palette movement part 47 so that the palette 24 is accommodated in the palette accommodating part 23 of the specified accommodating address.

Here, the accommodating address is specified and input through the operation panel 15 which is used as an input device provided at the component mounting device 1, but the input device may be provided at the tray feeder 5 directly. Operation buttons provided for every palette accommodating part 23, an input panel in a touch panel form or the like can be selected appropriately as the input device. That is, in the first method, the accommodating address specifying unit is the input device which is provided at the component mounting device 1 or the tray feeder 5, and an operator OP specifies the accommodating address through the input device so that the accommodating address of the palette accommodating part 23 of the return destination is specified.

Next, in a second method, first, the feeder control part 30 receives a readout result which is obtained after the palette identification mark M of the palette 24 is read out by the palette information readout sensor 32 so that the palette 24 is identified. Then, the feeder control part 30 specifies an accommodating address corresponding to the identified palette 24 as the accommodating address where the palette 24 should be returned by referring to palette accommodating data 44c through the body control device 14. Herein, the feeder control part 30 functions as a palette accommodating control unit which specifies the accommodating address where the palette 24 should be returned based on the identification result of the palette identification mark M and the palette accommodating data 44c.

That is, in the second method, the accommodating address specifying unit includes the palette information readout sensor 32 (identification unit) which identifies the palette identification mark M which is provided on the palette 24 that is provided in the tray feeder 5 as an identification sign, and the palette accommodating control unit which specifies the accommodating address where the palette 24 should be returned based on the identification result of the palette identification mark M and the palette accommodating data 44c which indicate the correspondence of the palettes and the accommodating addresses of the palette accommodating parts 23.

Figure 5:
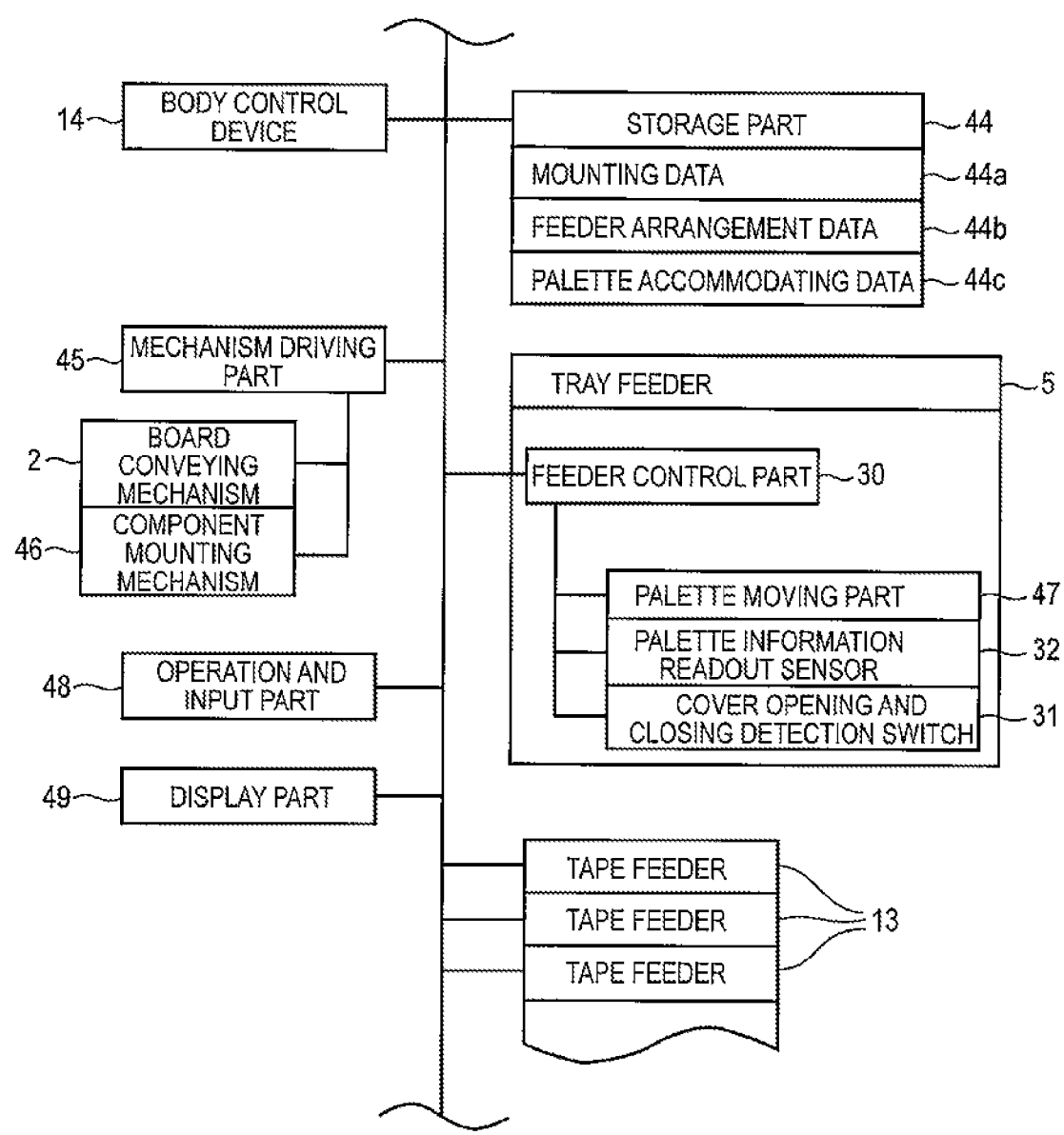
FIG. 5 is a block diagram which shows the structure of a control system of the component mounting device of the embodiment of the invention.

Next, the structure of a control system is described with reference to FIG. 5. The body control device 14 refers to various data stored in the storage part 44 to control the following parts to make the component mounting operation to be performed by the component mounting device 1. Mounting data 44a, feeder arrangement data 44b and the palette accommodating data 44c are stored in the storage part 44. The mounting data 44a are data used for performing component mounting operations on the board 3, and include component data which indicate the component types which are to be mounted on the board 3, position data of the component mounting points on the board 3, and sequence data which indicate a mounting order.

The feeder arrangement data 44b are data which identify the correspondence of the arrangement positions of the individual tape feeders 13 in the component supply part 4B and the component types which the tape feeders 13 accommodate. The palette accommodating data 44c are data which indicate the correspondence of the palettes 24 and the accommodating addresses in the palette accommodating parts 23 in the tray feeder 5 of the component supply part 4A. The correspondence of the accommodating addresses of the individual palette accommodating parts 23 and the component types of the trays 6 which are accommodated in the palette accommodating parts 23 by being held in the palettes 24 is specified with the palette accommodating data 44c.

In the component mounting operation, by referring to the mounting data 44a, the feeder arrangement data 44b and the palette accommodating data 44c, the tape feeder 13 or the palette 24 whose components should be picked up by the unit transferring heads 10 of the mounting head 9A can be specified for each of the individual component mounting actions. A mechanism driving part 45 is controlled by the body control device 14 to drive the board conveying mechanism 2 and the component mounting mechanism 46 formed as above. Thereby, the component mounting operations are performed continuously on a plurality of boards 3 by the component mounting device 1.

By installing the tray feeder 5 in the component supply part 4A, the feeder control part 30 is connected to the control system of the component mounting device 1, and becomes able to receive/deliver control signals from/to the body control device 14. Likewise, by installing the tape feeders 13 in the component supply part 4B, each of the tape feeders 13 is connected to the control system of the component mounting device 1. The feeder control part 30 controls the palette moving part 47 formed as above, and thereby palette movements in the tray feeder 5 are controlled. The readout result of the palette information readout sensor 32, namely, the presence or absence of the palette 24 in the palette carrying part 27 and the reading result of the palette identification mark M which is formed on the palette 24, is transmitted to the feeder control part 30, and is referred to by the feeder control part 30 in the control of the palette movements. The detection result of the cover opening and closing detection switch 31 is transmitted to the feeder control part 30 and the body control device 14 through the feeder control part 30, and is referred to by the body control device 14 in the control of the component mounting operations of the component mounting mechanism 46.

That is, if the opening and closing cover 28 is opened when the palette 24 which holds the tray 6 whose components are used up is moved to the palette carrying part 27 and is exported outside the feeder body 22 for the purpose of tray exchange, and a cover opening signal which indicates that the above situation is detected by the cover opening and closing detection switch 31 is transmitted to the body control device 14, the body control device 14 stops the pickup movements of the unit transferring heads 10 of the mounting head 9A. Thereafter, when the cover opening and closing detection switch 31 detects that the opening and closing cover 28 is closed, the body control device 14 resumes the pickup movements of the unit transferring heads 10 of the mounting head 9A.

At this time, if the operator OP performs an operation of closing the opening and closing cover 28 before the palette 24 after the tray exchange is carried on the palette carrying part 27, it is considered that an operation resuming order for a palette 24 except the palette 24 in the tray exchange is received, and the feeder control part 30 makes the palette holding part 25 to draw out the palette 24 from another palette accommodating part 23 and resumes the pickup movement. The cover opening and closing detection switch 31 is used as an operation resuming input unit to input an operation resuming order here, but it is needless to say that the operation resuming order may be input through other input unit, for example, the touch panel switch which is provided at the operation panel 15.

An operation and input part 48 is an input device which is provided at the operation panel 15, and performs input processes such as operation commands or data inputs to the component mounting device 1. In this embodiment, these inputs are performed through the touch panel switch which is provided at the operation panel 15, and the input for specifying the accommodating address when the palette 24 after the tray exchange is returned from the palette carrying part 27 to the palette accommodating part 23 is also performed through the operation panel 15. A display part 49 is a display panel such as a liquid crystal panel, and displays screens such as guide screens at the time of the input of the operation and input part 48. In this embodiment, the display screen which is provided at the operation panel 15 becomes the display part 49.

The component mounting device 1 is formed as above described, and a tray exchanging method for exchanging a tray 6 whose components are used up with a new tray 6 in the tray feeder 5 which is installed to the component mounting device 1 is explained with reference to FIGS. 6(a) to 6(d), 7(a) to 7(d) and 8(a) to 8(c) below. FIG. 6(a) shows that during the component mounting operation of taking out components with the unit transferring heads 10 of the mounting head 9A from the tray 6 which is held on the palette 24 which is moved to the component takeout position P by the palette holding part 25, the components in a first tray 6(1) which is taken out from a palette accommodating part 23 (1) of an accommodating address (1) are used up.

In this case, as shown in FIG. 6(b), the first palette 24(1) which holds the first tray 6(1)* whose components are used up is moved to the palette carrying part 27 by the palette holding part 25 for the purpose of tray exchange (arrows g and h) (first palette moving step). Then, as shown in FIG. 6(c), the opening and closing cover 28 is opened (arrow i), and the first palette 24(1) which holds the first tray 6(1)* is taken out from the palette carrying part 27 (arrow j) by an operator OP (first palette takeout step). At this time, the cover opening and closing detection switch 31 detects that the opening and closing cover 28 is opened so that the pickup movements of the unit transferring heads 10 of the mounting head 9A are temporarily stopped.

Then, as shown in FIG. 6(d), an exchange operation of replacing the tray 6(1)* whose components are used up with a new tray 6(1) is performed on the first palette 24(1) by the operator OP at the outside of the tray feeder 5. When the opening and closing cover 28 is closed by the operator OP during the tray exchange operation, and the closing movement is detected by the cover opening and closing detection switch 31, the detection signal is considered to be an operation resuming order to resume the pickup movements of the unit transferring heads 10 of the mounting head 9A. Here, it is detected by the palette information readout sensor 32 that there is no palette 24 in the palette carrying part 27, and the pickup movements are resumed by drawing out a palette 24 from another palette accommodating part 23. In the example shown herein, a second palette 24(2) is drawn out from a palette accommodating part 23(2) of an accommodating address (2) by the palette holding part 25 (arrows l and m).

As shown in FIG. 7(a), the component mounting operation of taking out components with the unit transferring heads 10 of the mounting head 9A from the second tray 6(2) which is held in the second palette 24(2) which is moved to the component takeout position P by the palette holding part 25 is resumed. That is, after the first palette takeout step, if the operation resuming order is received before the first palette 24(1) which has been tray exchanged is carried on the palette carrying part 27, the pickup movement is resumed for a palette (the second palette 24(2) here) except the first palette 24(1).

Figure 7:
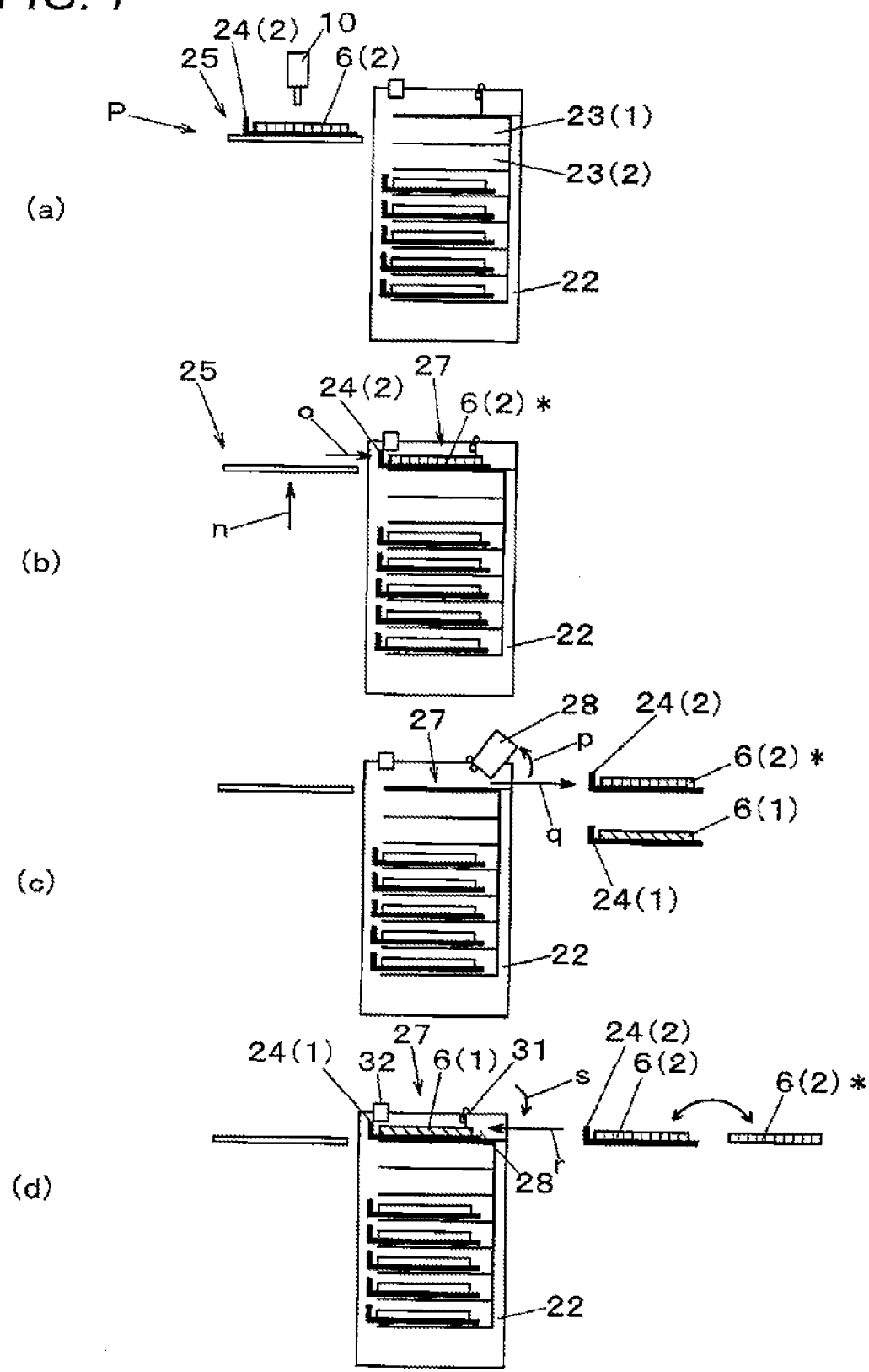
FIGS. 7(a), 7(b), 7(c) and 7(d) are illustrative figures which show steps of the tray exchanging method in the tray feeder of the embodiment of the invention.

During the component mounting operation in which the pickup movement is repeatedly performed, when the components in the second tray 6(2) are used up and the tray exchange operation for the first palette 24(1) has not been completed, the second palette 24(2) which holds the second tray 6(2)* whose components are newly used up is moved to the palette carrying part 27 by the palette holding part 25 for the purpose of tray exchange (arrows n and o), as shown in FIG. 7(*b*) (second palette moving step). Then, as shown in FIG. 7(*c*), the opening and closing cover 28 is opened (arrow p), and the second palette 24(2) which holds the second tray 6(2)* is taken out from the palette carrying part 27 (arrow q) by the operator OP (second palette takeout step).

Then the first palette 24(1) or the second palette 24(2) which has been taken out from the tray feeder 5 and tray exchanged is imported and carried on the palette carrying part 27 (palette carrying step). That is, it is a principle to first carry the palette 24 whose tray exchange operation is completed earlier on the palette carrying part 27, but it is not required to perform necessarily according to this order depending on the situation. In the example shown herein, the first palette 24(1) whose tray exchange operation is completed is in a standby state. After the second palette 24(2) is taken out, as shown in FIG. 7(*d*), the first palette 24(1) which has been tray exchanged is imported (arrow r) and carried on the palette carrying part 27, and then the opening and closing cover 28 is closed (arrow s).

The palette 24 is identified by reading out the palette identification mark M (refer to FIG. 4(*a*)) formed on the carried palette 24 with the palette information readout sensor 32. The closing movement to close the opening and closing cover 28 is detected by the cover opening and closing detection switch 31 and thereby the output detection signal is considered to be an operation resuming order to make the pickup movements of the unit transferring heads 10 of the mounting head 9A to be resumed. That is, an operation resuming order to make the pickup movements to be resumed is input with the closing movement to close the opening and closing cover 28 (operation resuming input step).

Figure 6:
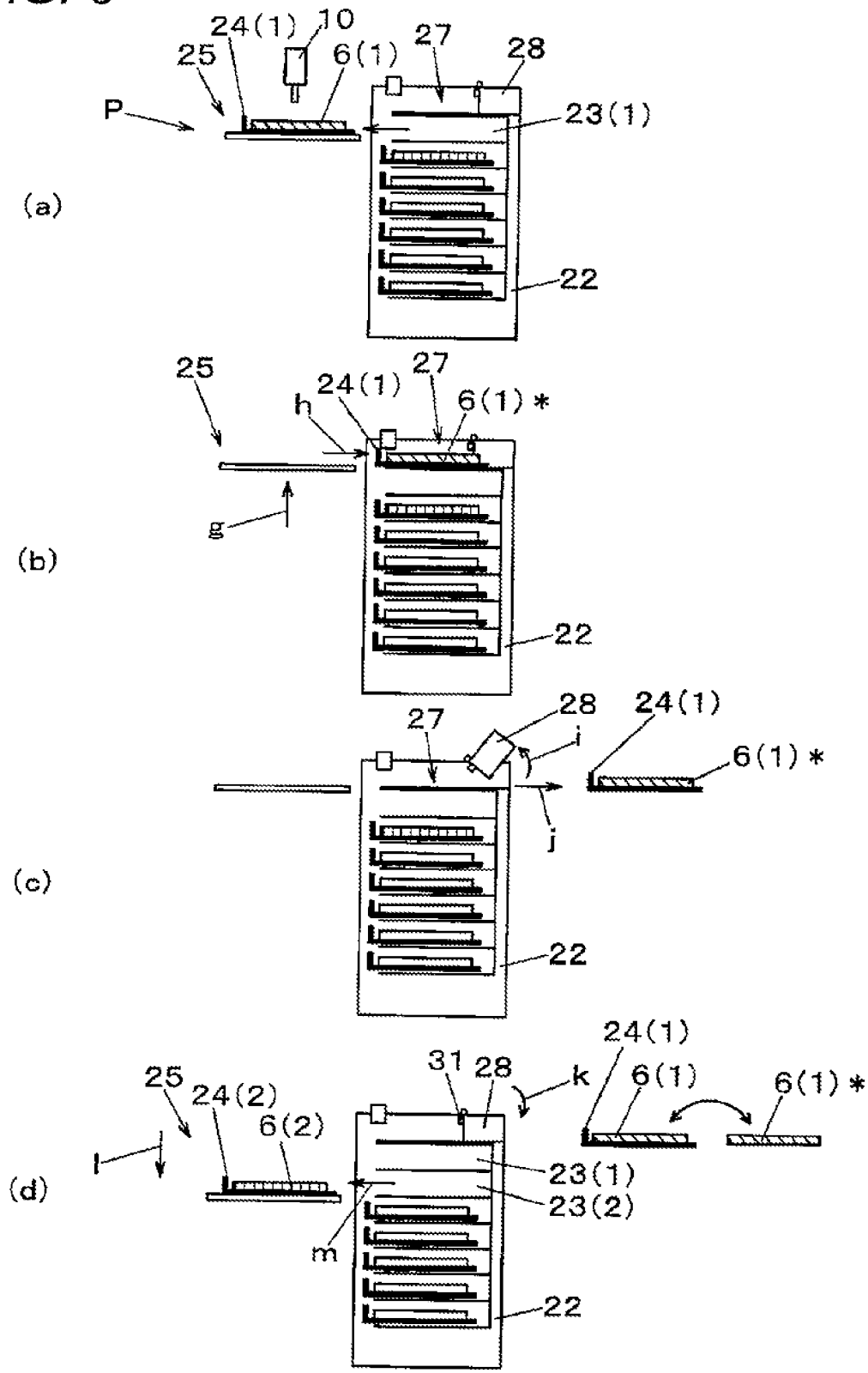
FIGS. 6(a), 6(b), 6(c) and 6(d) are illustrative figures which show steps of a tray exchanging method in the tray feeder of the embodiment of the invention.

After this, a palette movement for the operation resuming is performed. In case of this palette movement, at the time point when the components of the first tray 6(1) are used up as shown in FIG. 6(*a*), since the components which are the components 60 which should be mounted are used up, it is determined by the body control device 14 whether there are un-mounted components which have not been mounted on the board 3. Here, when it is determined that there are un-mounted components, the first palette 24(1) taken out from the component carrying part 27 is moved to the component takeout position P by the palette holding part 25, and the component mounting action for supplementarily mounting the remaining un-mounted components is performed.

Figure 8:
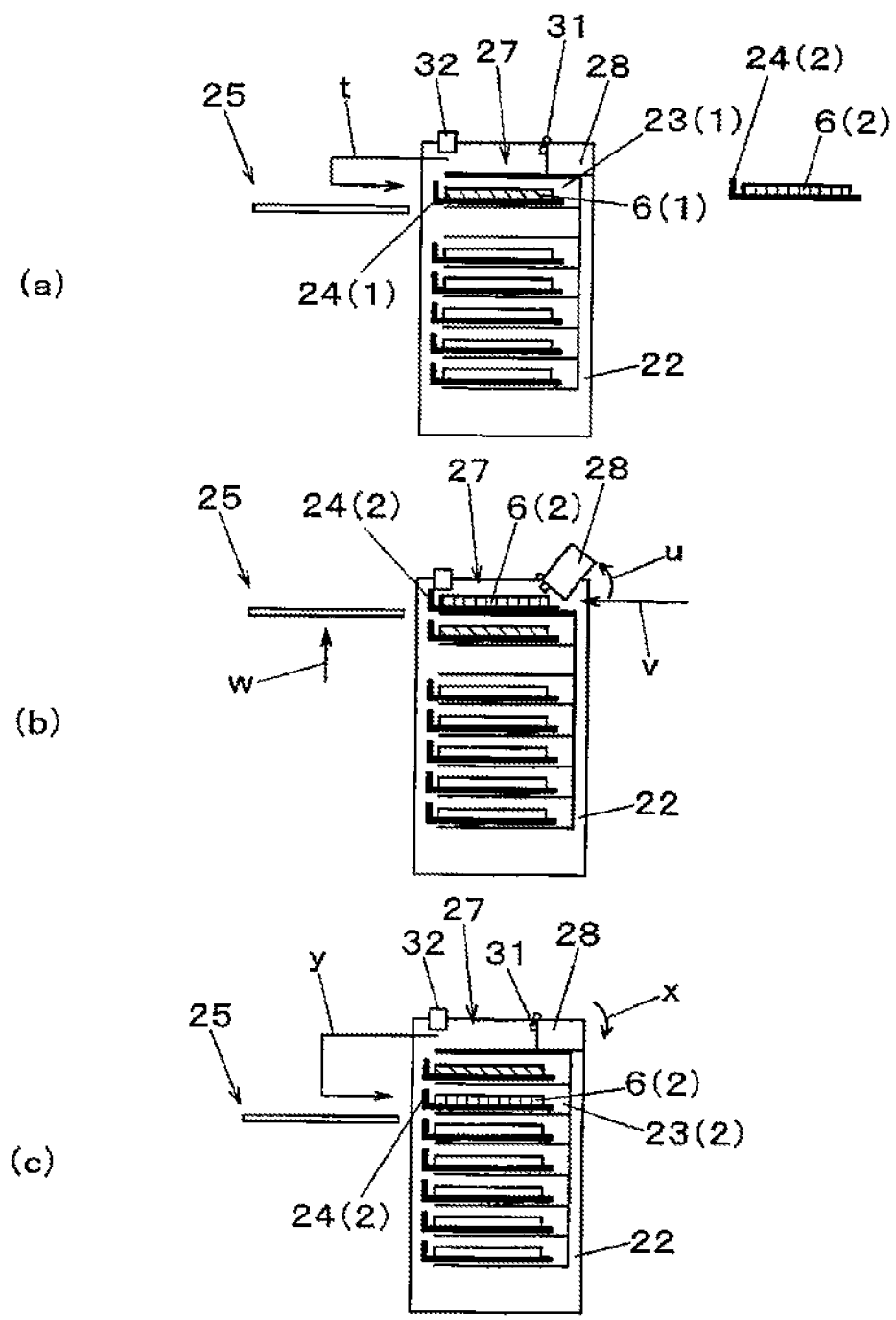
FIGS. 8(a), 8(b) and 8(c) are illustrative figures which show steps of the tray exchanging method in the tray feeder of the embodiment of the invention.

The first palette 24(1) after this supplementary mounting is completed, as shown in FIG. 8(*a*), is returned into the palette accommodating part 23(1) of the return destination specified based on the identification result of the palette 24 of the palette information readout sensor 32 and the correspondence of the accommodating addresses prescribed in the palette accommodating data 44*c* and the individual palettes 24. When it is determined that there is no un-mounted component, the supplementary mounting is not required and the first palette 24(1) is directly returned from the palette carrying part 27 to the palette accommodating part 23(1) of the return destination (arrow t). In this state, the second palette 24(2) whose tray exchange operation is completed is in a standby state.

After this, as shown in FIG. 8(*b*), the opening and closing cover 28 is opened (arrow u) and the second palette 24(2) which has been tray exchanged is imported (arrow v) and carried on the palette carrying part 27, and then the opening and closing cover is closed (arrow x shown in FIG. 8(*c*)). At this time, the palette holding part 25 is moved to align with the palette carrying part 27 (arrow w). Then, the operation steps after FIG. 7(*d*) for the first palette 24(1) are executed for the second palette 24(2) likewise. That is, the palette 24 is identified by reading out the palette identification mark M formed on the carried palette 24 with the palette information readout sensor 32. The closing movement to close the opening and closing cover 28 is detected by the cover opening and closing detection switch 31, and thereby the output detection signal is input as an operation resuming order.

After this, a palette movement for the operation resuming is performed. In case of this palette movement, likewise, at the time point when the components of the second tray 6(2) are used up as shown in FIG. 7(*a*), it is also determined whether there are un-mounted components. Here, when it is determined that there are un-mounted components, the second palette 24(2) taken out from the component carrying part 27 is moved to the component takeout position P by the palette holding part 25, and the component mounting action for supplementarily mounting the remaining un-mounted components is performed.

The second palette 24(2) after this supplementary mounting is completed, as shown in FIG. 8(*c*), is returned into the palette accommodating part 23(2) of the return destination specified based on the identification result of the palette 24 of the palette information readout sensor 32 and the correspondence of the accommodating addresses prescribed in the palette accommodating data 44*c* and the individual palettes 24 (arrow y). When it is determined that there is no un-mounted component, the supplementary mounting is not required and the second palette 24(2) is directly returned from the palette carrying part 27 to the palette accommodating part 23(2) of the return destination.

That is, the operation steps shown in FIGS. 7(*d*) to 8(*c*) are equivalent to a palette moving step in which according to the operation resuming order with the closing movement of the opening and closing cover 28, either of the first palette 24(1) and the second palette 24(2) which is carried is moved to the component takeout position P for the supplementary mounting of the un-mounted components, or is returned to the palette accommodating part 23 which corresponds to the accommodating address of the return destination of the palette 24 specified by the accommodating address specifying unit.

In the above embodiment, the accommodating address specifying unit includes the palette information readout sensor 32 (identification unit) which reads out and identifies the palette identification mark M (identification sign) which is formed on the palette 24 that is provided in the tray feeder 5, and the feeder control part 30 (palette accommodating control unit) which specifies the accommodating address of the palette accommodating part 23 where the palette 24 should be returned based on the identification result and the palette accommodating data 44*c* which indicate the correspondence of the individual palettes and the accommodating addresses of the palette accommodating parts 23. By reading and identifying the palette identification mark M of the palette 24 which is carried in the palette carrying step, the accommodating address of the palette accommodating part 23 of the return destination is specified.

The input device which is provided at the control device of the component mounting device 1 or the tray feeder, such as the touch panel switch or the like which is provided at the operation panel 15 may be used as the accommodating address specifying unit, and an operator OP may specify the accommodating address of the return destination by inputting the accommodating address through the input device in the palette moving step.

As explained above, in the component mounting device 1 shown in the present embodiment, an accommodating address specifying unit is included which specifies the accommodating address of the return destination of the palette movement in which the palette 24 which holds the tray 6 whose components are used up in the tray feeder 5 is moved from the palette carrying part 27 for the exchange with a new tray 6 to the palette accommodating part 23 for the return. Thus, in the component mounting device 1 which mounts components supplied by the tray feeder 5 on the board 3, even if the components in two or more palettes 24 are used up in the same period, the palettes 24 can be returned to the palette accommodating parts 23 corresponding to the accommodating addresses of the return destinations specified by the accommodating address specifying unit. Therefore, compare with the conventional art in which other palettes cannot become the object of the tray exchange operation until the tray exchange of one palette is completed, the productivity can be improved since the device stop time for the tray exchange is shortened.

The invention is intended to cover various alterations and applications made by those who are skilled in the art on the basis of the description of the specification and well-known technology without departing from the spirit and scope of the present invention, and these alterations and applications shall fall within a range where protection of the invention is sought. Without departing from the spirit of the invention, the component elements in the above embodiment may be combined arbitrarily.

This application is based on the Japanese patent application (patent application 2010-263368) filed on Nov. 26, 2010, whose contents are incorporated herein by reference.

INDUSTRIAL APPLICABILITY

The component mounting device and the tray exchanging method in the tray feeder of the invention have an effect of improving the productivity by shortening the device stop time for the purpose of tray exchange in the component mounting device which mounts components supplied by the tray feeder on a board, and are useful in the component mounting field of mounting components on boards.

DESCRIPTION OF THE SYMBOLS 1 component mounting device
3 board
4A and 4B component supply part
5 tray feeder
6 tray
60 component
7 Y axis movable table
8A and 8B X axis movable table
9A and 9B mounting head
10 unit transferring head
13 tape feeder
15 operation panel
22 feeder body
23 palette accommodating part
24 palette
25 palette holding part
26 holding part elevating mechanism
27 palette carrying part
28 opening and closing cover
31 cover opening and closing detection switch
32 palette information readout sensor
38 slide driving motor

The invention claimed is:

1. A tray exchanging method in a tray feeder, which is used by being installed to a component mounting device which mounts components on boards, and in which palettes which hold trays in which the components are stored are respectively accommodated in a plurality of palette accommodating parts and the palette is moved to a component takeout position, for exchanging the tray whose components are used up with a new tray, wherein the tray feeder comprises a feeder body in which the plurality of palette accommodating parts are provided to correspond to accommodating addresses, a palette carrying part which is provided in an area different from the palette accommodating parts, on which a palette which holds a tray whose components are used up can be carried, and from which the palette can be exported to the outside of the feeder body for the purpose of tray exchange, a palette moving part which performs palette movements including taking out the palette from the plurality of palette accommodating parts, making the palette to be moved to the component takeout position or onto the palette carrying part, and returning the palette to the palette accommodating part, an accommodating address specifying unit which specifies the accommodating address of the return destination of the palette in the palette movement from the palette carrying part to the palette accommodating part, an opening and closing cover provided in the feeder body, and a cover opening and closing detection switch as an operation resuming input unit which inputs an operation resuming order to resume the operation of picking up components of the mounting head after the pickup operation is temporarily stopped as a result of that the palette which holds the tray whose components are used up is moved onto the palette carrying part and exported to the outside of the feeder body, and the tray exchanging method comprising:

a first palette moving step to make a first palette which holds the tray whose components are used up to be moved to the palette carrying part, a first palette takeout step to take out the first palette from the palette carrying part, a second palette moving step to make a second palette which holds the tray whose components are newly used up to be moved to the palette carrying part when the tray exchange operation of the first palette has not been completed, a second palette takeout step to take out the second palette from the palette carrying part, a palette carrying step to carry either of the first palette and the second palette which has been tray exchanged onto the palette carrying part, an operation resuming input step to input an operation resuming order to make the pickup movement to be resumed by detecting the opening and closing cover being closed by the cover opening and closing detection switch, and a palette moving step to, after the input of the operation resuming order, make either of the first palette and the second palette which is carried to be moved to the component takeout position or returned to the palette accommodating part of the accommodating address of the return destination of the palette which is specified by the accommodating address specifying unit according to the received operation resuming order based on the identification result of the identification sign and palette accommodating data which indicate the correspondence of the palettes and the accommodating addresses of the palette accommodating parts.

2. The tray exchanging method in the tray feeder according to claim 1, wherein after the first palette takeout step, if the operation resuming order is received before the first palette which has been tray exchanged is carried on the palette carrying part, the pickup movement is resumed for a palette except the first palette.

3. The tray exchanging method in the tray feeder according to claim 1, wherein the accommodating address specifying unit is an input device which is provided at a control device of the component mounting device or the tray feeder, and in the palette moving step, an operator specifies the accommodating address through the input device so that the accommodating address of the return destination is specified.

4. The tray exchanging method in the tray feeder according to claim 1, wherein the accommodating address specifying unit includes an identification unit which identifies an identification sign which is formed on the palette that is provided in the tray feeder, and a palette accommodating control unit which specifies the accommodating address where the palette should be returned based on the identification result of the identification sign and palette accommodating data which indicate the correspondence of the palettes and the accommodating addresses of the palette accommodating parts, and wherein the identification sign of the palette carried in the palette carrying step is identified so that the accommodating address of the return destination is specified.

* * * * *